United States Patent [19]
Yonezawa

[11] Patent Number: 4,791,844
[45] Date of Patent: Dec. 20, 1988

[54] KNOCKOUT DEVICE FOR PUNCHING A WORK PLATE IN A PRESS-MACHINE

[75] Inventor: Keitaro Yonezawa, Amagasakishi, Japan

[73] Assignee: Kabushiki Kaisha KOSMEK, Hyogoken, Japan

[21] Appl. No.: 137,813

[22] Filed: Dec. 24, 1987

[30] Foreign Application Priority Data

Dec. 26, 1986 [JP] Japan ................. 61-314774

[51] Int. Cl.$^4$ ............ B21D 45/04; B21D 28/34; B26F 1/14
[52] U.S. Cl. ........................ 83/133; 83/137; 83/615; 83/620
[58] Field of Search ............ 83/133, 137–140, 83/142, 390, 615, 620, 691; 72/427; 100/218

[56] References Cited

U.S. PATENT DOCUMENTS

| | | | |
|---|---|---|---|
| 2,642,138 | 6/1953 | Macewka | 83/137 |
| 3,570,343 | 3/1971 | Wolnosky et al. | 83/137 X |
| 3,797,342 | 3/1974 | Sekel | 83/133 X |

FOREIGN PATENT DOCUMENTS

| | | | |
|---|---|---|---|
| 60-32916 | 10/1985 | Japan | 83/133 |
| 60-34426 | 10/1985 | Japan | 83/133 |

Primary Examiner—E. R. Kazenske
Assistant Examiner—Hien H. Phan
Attorney, Agent, or Firm—Lowe, Price, LeBlanc, Becker & Shur

[57] ABSTRACT

In a knockout device which is mounted in a press-machine in order to knock out a punched work plate such as a printed board and the likes from punches through a knockout actuation-plate, cylinder chambers as an oil hydraulic knockout cylinder is formed in the upper portion of a base plate fixedly secured to the underside of a slide and an actuation-plate guide hole is formed in the lower portion of the base plate respectively. The cylinder chambers are disposed at the eccentric positions offset toward the periphery of the actuation-plate hole respectively. The knockout actuation-plate provided in the actuation-plate guide hole is adapted to be driven downwardly protrusively by the pistons provided in the cylinder chambers, and to be linearly guided by the peripheral surfaces of the knockout actuation-plate and of the linear guide boss protruded upwardly from the central portion of the knockout actuation-plate.

6 Claims, 5 Drawing Sheets

KNOCKOUT DEVICE FOR PUNCHING A WORK PLATE IN A PRESS-MACHINE

BACKGROUND OF THE INVENTION

1. Field of the Invention

The present invention relates to a knockout device which serves to knock out a work plate such as a printed board and the likes after a punching for the work plate is completed in a press-machine such as a mechanical press and an oil hydraulic press, etc.

2. Prior Art

As a technology to be premised for such a knockout device, have so far been known ones disclosed in Japanese utility model publication No. 32916 of 1985 (referred to as first conventional embodiment hereinafter) and in Japanese utility model publication No. 34426 of 1985 (referred to as second conventional embodiment hereinafter). These first and second conventional embodiments have the nearly same basic constructions as that of the present invention.

Now the basic construction will be explained with reference to FIGS. 5 and 6 showing the first conventional embodiment and to FIG. 7 showing the second conventional embodiment hereinafter.

By the way, the component parts having the same functions in the first and the second conventional embodiments are indicated by the same symbols in common.

That is, in a knockout device, there are provided a plurality of punches 113 fixedly secured to the underside of a base plate 108 through a punch fixation plate 109 and a punch support plate 110 so as to protrude downwardly. A work fixation plate 114 is fitted to the punches 113 vertically slidably. A cylinder chamber 120 of an oil hydraulic knockout cylinder 119 is formed in the upper portion of the base plate 108 and an actuation-plate guide hole 121 is formed in the lower portion thereof. A piston 122 is provided vertically slidably in the cylinder chamber 120, and a knockout actuation-plate 123 is provided vertically slidably n the guide hole 121. A plurality of knockout pins 124 are provided so as to pass vertically slidably through both the punch fixation plate 109 and the punch support plate 110, and the work fixation plate 114 is adapted to be actuated downwardly by the downward movement of the piston 122 through the knockout actuation-plate 123 and the knockout pins 124 so as to knock out downwardly the punched work plate frictionally engaged with the punches 113.

The knockout device having this basic construction, for example as shown in FIG. 5, is fixedly secured to the slide 103 of the press-machine 101 so as to be driven vertically and integratedly therewith 103.

When the slide 103 is moved to the top dead center in the vertical movement thereof, the cylinder chamber 120 is adapted to be pre-pressurized by a cushion pressure oil supplied from an oil hydraulic control device (but not shown in Figs.) so that the work fixation plate 114 is pushed to a lower position than that of the punches 113 through both the knockout actuation-plate 123 and the knockout pins 124.

During the descendant actuation stroke to perform a punching work, first of all the work fixation plate 114 abuts onto the work plate 106 so as to fix it by the cushion pressure in the cylinder chamber 120. And then the punches 113 continue to descend and protrude toward the lower side of the work fixation plate 114 so that the work plate 106 is punched thereby.

When the slide 103 reaches the bottom dead center, the work plate 106 tends to frictionally engage with the punches 113 after the completion of punching.

During the ascendant restoration stroke for the knockout operation, the work plate 106 is raised by the punches 113 in a frictional engagement therewith and then it is separated from the punches 113 by the knockout operation of the work fixation plate 114 which is moved downwardly through the knockout pins 124 by the knockout oil pressure supplied to the cylinder chamber 120 by the oil hydraulic control device.

After that, the pressure in the cylinder chamber 120 is reduced to the value of the cushion oil pressure, the slide 103 returns to the top dead center thereof again, and one cycle of the punching work is completed.

In the above-mentioned knockout device, in case that the knockout actuation-plate 123 inclines, the work fixation plate 114 is also inclined through the knockout pins 124, and then the punches 113 are subjected to a bending to cause some offsets relative to the punch holes 104a provided in the lower die 104. Therefore, the punches 113 and the punch holes 104a are apt to suffer abnormal abrasions and breakages.

In order to solve these problems, there is provided a means for guiding the knockout actuation-plate 123 vertically linearly in the base plate 108. As shown in FIG. 6 the guide ratio $\tan \theta [= $ guide height$(h_2)$/guide width$(l_2)]$ is set to a constant value.

In the basic construction, the linear guide construction for the knockout actuation-plate 123 is constructed as follows in a prior art.

[First Conventional Embodiment (refer to FIG. 6)]

The cylinder chamber 120 is disposed concentrically with the actuation-plate guide hole 121 and the piston 122 is formed integratedly with the knockout actuation-plate 123 so that the movement of the knockout actuation-plate 123 is guided linearly by itself and the piston 122.

[Second Conventional Embodiment (refer to FIG. 7)]

The actuation oil chamber 162 in the above-mentioned first embodiment is modified in such a configuration as the peripheral portion 164 of the upper wall 162a is positioned higher than the central portion 163 thereof. Accordingly, the thickness of the peripheral portion 164 is made thin while the shearing strength of the peripheral portion 164 is kept sufficiently strong relative to the bending strength of the central portion 163. And the upper face 122a of the piston 122 is formed in a concave configuration so as to fit into the central portion 163 of the upper wall 162a of the actuation oil chamber 162 and to locate the piston 122 and the knockout actuation-plate 123 at a high position. As the result, the thickness of the base plate 108 can be made thinner.

There are, however, a number of following disadvantages associated with the above-mentioned first conventional embodiment (refer to FIG. 6).

(1) The thickness of the base plate 108 is large

Since it is necessary to enlarge the diameter ($d_2$) of the piston 122 in order to generate the knockout force, the guide width ($l_2$) is also set to be large for securing a constant guide ratio ($\tan \theta$) as well as the guide height ($h_2$) is set to be large according thereto. Further, it is required to provide the upper wall 162a over the actuation oil chamber 162. Since the thickness (t) of the actuation oil chamber upper wall 162a is required to be large enough to secure a sufficient bending strength at the central portion therof and a sufficient shearing strength at the peripheral portion, the thickness ($T_2$) of the base plate 108 gets larger.

Hence, the space under the slide 103 of the press-machine 101 gets smaller, and the allowed height of the die utilized within the limit of the die-height (H) is limited to a smaller one.

Moreover, since the base plate 108 gets heavier, the manufacturing costs are increased, a large counterbalance cylinder (not shown in FIGS.) is required for the slide 103 of the press-machine 101, and an energy consumption gets more increased during the operation of the press-machine.

(2) Working oil leaks out from the cylinder chamber 120

The piston 122 is apt to produce fine abrasion powders due to a partial strong contact to the cylinder chamber 120 during the linear guide movement thereof. Since the fine abrasion powders enter between the slide surfaces for the piston 122 and injure a sealing packing 160, working oil leaks out from the cylinder chamber 120.

In the above second conventional embodiment (refer to FIG. 7), even through the base plate 108 can be made thinner by locating the piston 122 and the knockout acutation-plate 123 at the positions raised higher in correspondence with the thickness reduced at the peripheral portion 164 of the working oil chamber upper wall 162a, the thickness reduced in this embodiment is still too thick to attain a suitable thickness thereof and still has a margin for improvement.

Further, the problem that the working oil leakage is caused by the packing 160 injured by the fine abrasion powders from the piston 122 is not yet solved.

SUMMARY OF THE INVENTION

The present invention is directed to solving the problems noted above, and has the first object to make the thickness of a base plate in a knockout device thin sufficiently and the second object to prevent a packing for a piston therein from being injured by fine abrasion powders.

For accomplishing the above-mentioned objects, the present invention is characterized in that the above-mentioned basic construction is further constructed as follows as means for guiding the knockout actuation-plate linearly.

That is, the cylinder chamber of the oil hydraulic knockout cylinder being disposed at the eccentric positions offset toward the periphery of the actuation-plate guide hole relative to the center thereof, a linear guide hole being formed upwardly from the central portion of the upper plane of the actuation-plate guide hole in communication thereto, a linear guide boss being formed so as to protrude upwardly from the central portion of the knockout actuation-plate, and the linear guide boss being fitted vertically slidably into the linear guide hole so as to be guided thereby.

Since the present invention is constructed as mentioned above, following advantages can be attained.

(1) Since an upper wall can be excluded from the upper side of the linear guide boss and the guide height can be made smaller by reducing the diameter of the linear guide boss, the thickness of the base plate can be reduced remarkably.

Accordingly, the height of the knockout device becomes small, and hence the upper limit of the die height can be set to a large value in the press-machine. Moreover, the weight of the knockout device can be made lighter, the manufacturing cost can be reduced, and the couterbalance cylinder can be made small in size. And the energy consumption gets less during the press operation.

(2) Even though the linear guide boss contacts partially to the linear guide hole to produce fine abrasion powders, the powders is prevented from entering into the gap between the slide surfaces. And since the partial contact of the piston can be prevented by the partial contact of the linear guide boss, any abrasion powders are not produced by the piston. Therefore, the sealing packing for the piston is never injured by such abrasion powders and hence any working oil leakages are not caused thereby.

The foregoing and other objects and attendant advantages of the present invention will be readily appreciated as the same becomes better understood by reference to the following detailed description when considered by the accompanying drawings, wherein:

BRIEF DESCRIPTION OF THE DRAWINGS

FIG. 1 is an enlarged view of the prinipal part in FIG. 2;

FIG. 2 is a partial sectional front view of the press-machine in which a knockout device is mounted;

FIG. 3 is a partial view on the arrow line III—III in FIG. 2;

FIG. 4 is a schematic explanatory view;

FIG. 5 is a view corresponding to FIG. 2;

FIG. 6 is a view corresponding to FIG. 1; and

DESCRIPTION OF THE PREFERRED EMBODIMENT

Figure 2:
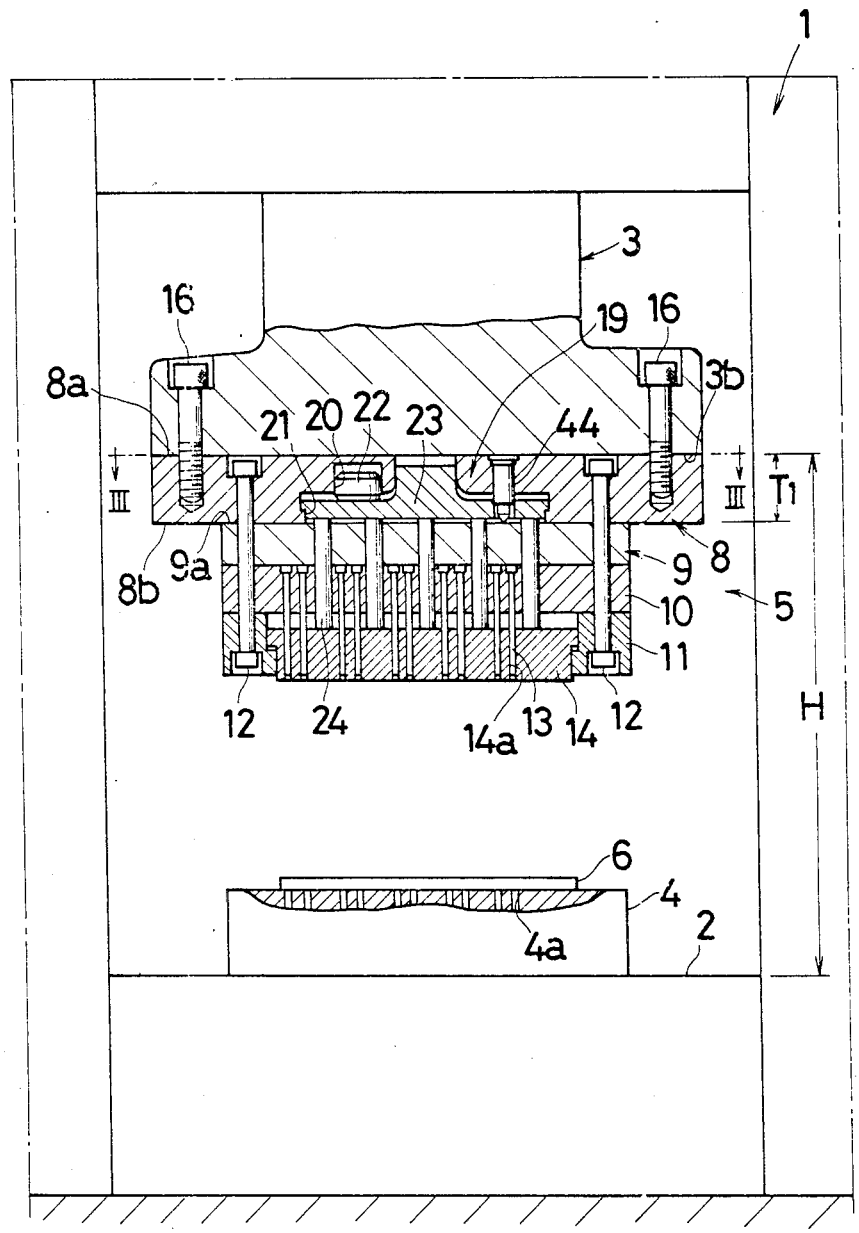

In FIG. 2, the symbol 1 is a press-machine, 2 is a bolster thereof, and 3 is a slide. A lower die 4 is fixedly secured onto the bolster 2, and an upper die 5 is fixedly secured to the slide 3 so as to be able to punch a printed board 6 (a work plate) placed on the lower die 4.

The upper die 5 comprises a base plate 8, a punch fixation plate 9, a punch support plate 10 and an underside plate 11 all of which are stacked up vertically and combined each other by a plurality of tie-rods 12. A plurality of punches 13 are fixedly secured onto the punch support plate 10 so as to protrude downwardly by the punch fixation plate 9 which presses the top ends of the punches 13 thereon. And in the underside plate 11, there is provided a work fixation plate 14 vertically slidably within a predetermined extent. The work fixation plate 14 are fitted vertically slidably to the punches 13 through guide holes 14a provided therein 14. The upper surface 8a of the base plate 8 is fixed to the lower surface 3b of the slide 3 by a plurality of bolts 16.

In the base plate 8, there is provided an oil hydraulic knockout cylinder 19 which comprises cylinder chambers 20 at the upper portion thereof and an actuation-plate guide hole 21 at the lower portion thereof. A piston 22 is fitted into the cylinder chamber 20 vertically slidably and a knockout actuation-plate 23 is fitted in the actuation-plate guide hole 21 vertically slidably. A plurality of knockout pin 24 are provided so as to pass through both the punch fixation plate 9 and the punch support plate 10 vertically slidably. And the lower end face of each knockout pin 24 is adapted to abut onto the upper surface of the work fixation plate 14, and the upper end face thereof 24 is adapted to abut to the lower surface of the knockout actuation-plate 23.

Figure 1:
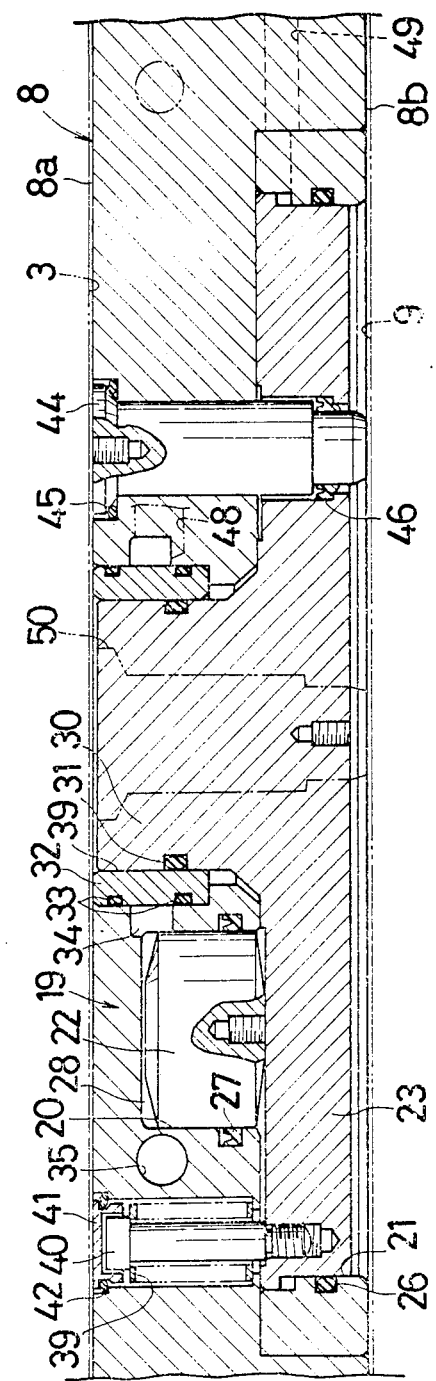
FIGS. 1 through 4 show one embodiment of the present invention.
Figure 3:
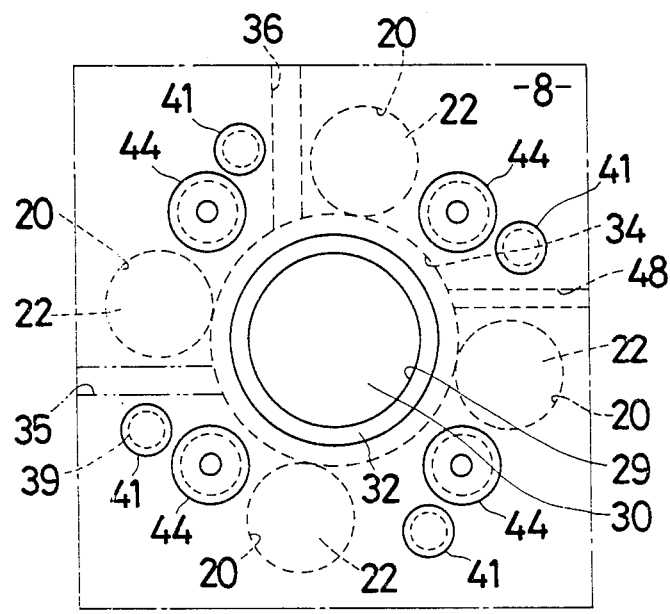

Now the knockout cylinder 19 will be explained more detailedly with reference to FIG. 1 and FIG. 3 hereinafter.

The actuation-plate guide hole 21 is formed in the base plate 8 in a cylindrical configuration from the lower surface thereof toward the upper side thereof. In the actuation-plate guide hole 21, there is provided the disk-like knockout actuation-plate 23 through an O-ring 26 vertically slidably. A plurality of cylinder chambers 20 are formed respectively at the eccentric positions offset toward the periphery of the actuation-plate guide hole 21 in a state of being opened downwardly in the base plate 8. These cylinder chambers 20 are disposed around the center axis of the knockout actuation-plate 23. A piston 22 is provided in each cylinder chamber 20 through a sealing packing 27 in an oil-tight manner and vertically slidably. At the upper side of the piston 22, there is provided an actuation oil chamber 28 respectively. And the lower surface of the piston 22 is in contact with the upper surface of the knockout actuation-plate 23.

And a linear guide hole 29 is formed upwardly from the central portion of the upper plane of the actuation-plate guide hole 21 so as to be opened at the upper surface 8a of the base plate 8. On the other hand, a linear guide boss 30 is formed so as to protrude upwardly from the central portion of the knockout actuation-plate 23, and is fitted into the linear guide hole 29 vertically slidably through an O-ring 31 so as to be guided thereby 29. The linear guide hole 29 is defined by the interior surface of a guide sleeve 32, of which exterior surface is fitted in an oil-tight manner within the base plate 8 through upper and lower O-rings 33, 33. A working oil delivery passage 34 is formed in an annular configuration along the peripheral exterior surface of the guide sleeve 32 between those upper and lower O-rings 33, 33 so as to connect to each actuation oil chamber 28. By the way, the symbol 35 is a supply passage, and 36 is an exhaust passage.

And there are provided a plurality of return springs 39 which serve to return the knockout actuation-plate 23 upwardly. That is, a plurality of spring engaging head bolts 40 are threadably mounted on the knockout actuation-plate 23 with being arranged in the peripheral direction, and the heads thereof are fitted into guide pieces 41 vertically slidably respectively. The upper end of the return spring 39 comprising a compression coil spring is engaged to the head of the bolt 40 in an abutted state and the lower end thereof is supported by the base plate 8. The guide pieces 41 are fitted to the base plate 8 through O-rings 42.

Further, there are provided a plurality of die-stiffener blocks 44 in a state of passing vertically through both the base plate 8 and the knockout actuation-plate 23 along the peripheral direction thereof. Each die-stiffener block 44 is held at the upper portion thereof by the base plate 8 through O-ring 45 and is fitted vertically slidably at the lower portion thereof into the knockout actuation-plate 23 through a sealing packing 46. The upper end face of the block 44 is abutted to the lower surface $3b$ of the slide 3, and the lower end fact thereof is abutted to the upper surface $9a$ of the punch fixation plate 9. Therefore, the central portion of the punch fixation plate 9 is prevented from being deflected during a punching work. The symbol 48 is a vent port, and 49 is a breathing port.

By the way, besides the above-mentioned embodiment in which a plurality of die-stiffener blocks 44 are arranged in the peripheral direction, may be adopted another embodiment in which another die-stiffener block 50 (shown by alternate long and two short dashes line in FIG. 1) can be provided at the center side by replacing the blocks 44 therewith or in addition thereto. The following advantages associated with the die-stiffener block 50 at the center side are attained.

Figure 6:
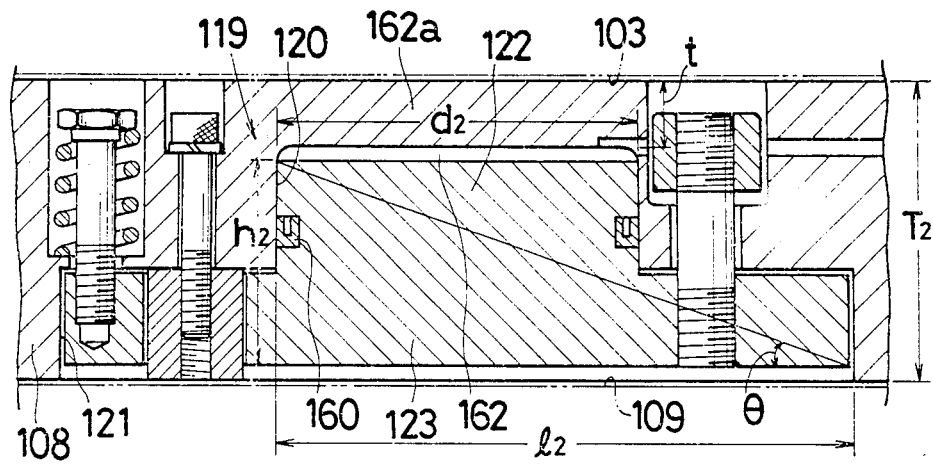
Figure 7:
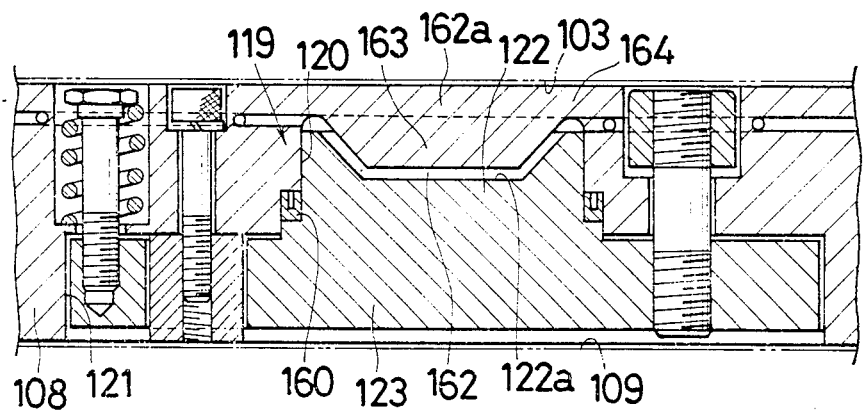
FIG. 7 is a view showing a second conventional embodiment corresponding to FIG. 1.

(a) In the conventional construction shown in FIGS. 6 and 7, in case that the die-stiffener block is provided at the central portion of the knockout actuation-plate 123, a sealing means becomes complicated because the die-stiffener block passes through the working oil chamber 162 and oil leakage is apt to be caused accompanying thereto. But in the present invention, this kind of problem can be solved because the die-stiffener block 50 is adapted not to pass through the working oil chamber 28.

(b) Since the sealing means for the working oil chamber is not required for the die-stiffener block 50 at the center side, it doesn't take a long time for the assembly and disassembly thereof.

(c) Further, since the die-stiffener block 50 at the center side can be made large in its diameter, a support pressure per unit aea for the slide 3 as well as the punch fixation plate 9 becomes small due to an enlarged contact area by the block 50.

By the way, instead of a plurality of cylinder chambers 20 arranged in the peripheral direction as for the knockout cylinder 19, the cylinder chamber 20 can be formed in an annular configuration in a plan view.

Now the functions of the present invention will be explained mainly with reference to FIG. 4 hereinafter.

Figure 4:
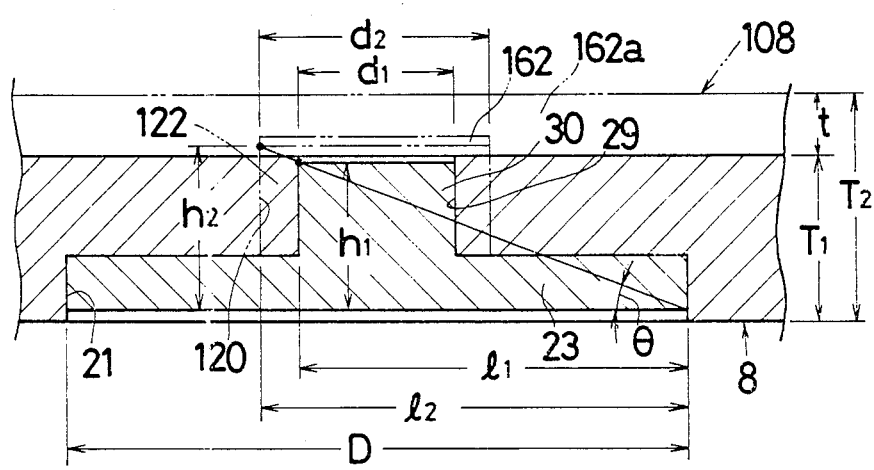
Figure 5:
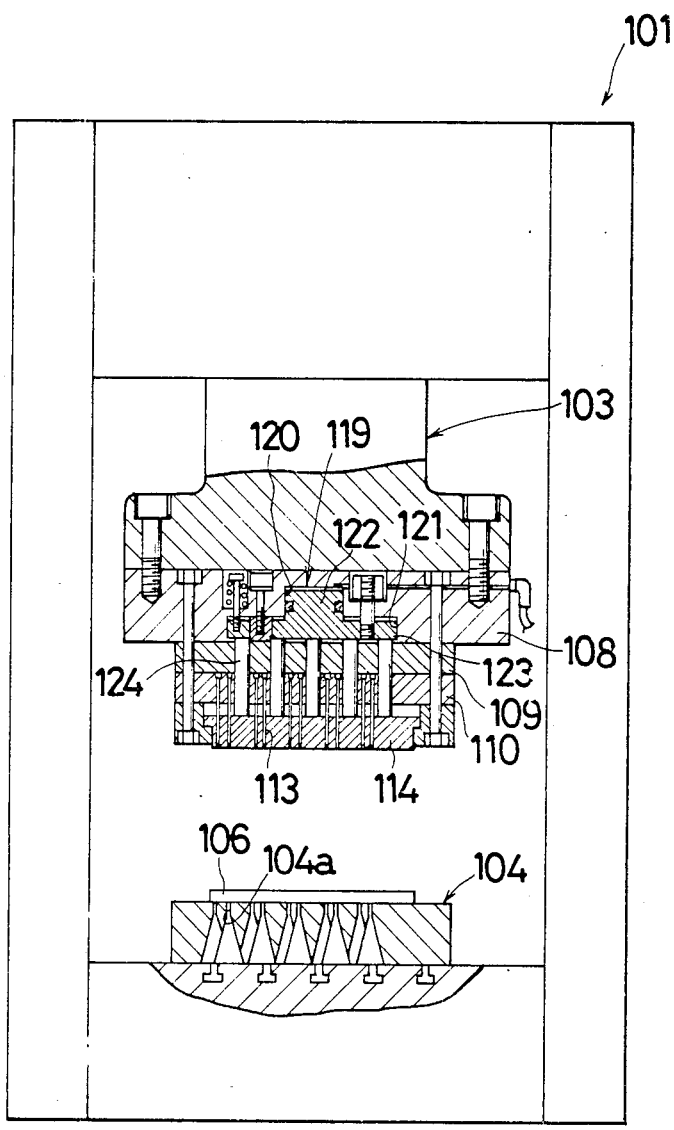
FIGS. 5 and 6 shows a first conventional embodiment.

By the way, in order to compare the present invention with the first conventional embodiment, the first conventional embodiment shown in FIG. 6 is indicated by phantom lines in FIG. 4.

In the present invention, as shown by the continuous line in FIG. 4, the knockout actuation-plate 23 is adapted to be guided linearly by the both peripheral surfaces thereof and of the linear guide boss 30.

Since the diameter ($d_1$) of the linear guide boss 30 may be made small enough to have a sufficient bending strength, the guide width ($l_1$) becomes shorter in order to have a constant guide ratio ($\tan \theta$) and also the guide height ($h_1$) gets small according thereto. And it becomes unnecessary to provide an upper wall over the linear guide hole 29. Further, as shown in FIG. 1, the piston 22 of the present invention can be provided at a low position of the base plate 8 without being restricted by the constant guide ratio ($\tan \theta$).

Therefore, the thickness ($T_1$) of the base plate 8 can be reduced considerably corresponding to a reduced dimension of the guide height and a dimension of the thickness (t) of the prior working oil chamber upper wall $162a$ removed from the upper side of the linear guide hole 29.

Consequently, in the case that the diameter (D) of th knockout actuation-plate 23 is 300 mm for example, the thickness ($T_1$) of the base plate 8 can be less than 90 mm in the present invention shown by continuous lines in FIG. 4. Otherwise the thickness (T₂) thereof is required to be 100 mm in the conventional construction. As the result, the thickness of the base plate 8 can be reduced remarkably.

In case that fine abrasion powders are produced by a partial contact of the liner guide boss 30 to the linear guide hole 29 during the linear guidance thereof, they happen to enter only into the linear guide hole 29 but don't enter into the cylinder chamber 20. And since the piston 22 is prevented from partially contacting to the cylinder chamber 20 by the partial contact of the linear guide boss 30, fine abrasion powders are not produced by the piston 22. As the result, the fine abrasion powders don't injure the packing 27 which serves to seal a slide gap for the piston 22.

I claim:

1. A knockout device for punching a work plate in a press-machine, including a plurality of punches fixed to the underside of a base plate through a punch fixation plate and a punch support plate so as to protrude downwardly, which device comprising, in combination:
    (a) a work fixation plate fitted to the punches vertically slidably;
    (b) a cylinder chamber of a hydraulic knockout cylinder formed in an upper portion of the base plate;
    (c) an actuation-plate guide hole formed in an lower portion of the base plate;
    (d) a piston provided vertically slidbly in the cylinder chamber;
    (e) a knockout actuation-plate provided vertically slidably in the actuation-plate guide hole;
    (f) a plurality of knockout pins passed vertically slidably through both the punch fixation plate and the punch support plate;
    (g) said work fixation plate being adapted to be actuated downwardly by the downward movement of the piston through the knockout actuation-plate and the knockout pins so as to knock out downwardly the punched work plate frictionally engaged to the punches;
    (h) said cylinder chamber of the hydraulic knockout cylinder being disposed at an eccentric postion offset toward the periphery of the actuation-plate guide hole relative to the center thereof;
    (i) a linear guide hole formed upwardly from the central portion of an upper plane of the actuation-plate guide hole in communication thereto;
    (j) a linear guide boss formed so as to protrude upwardly from a central portion of the knockout actuation-plate; and
    (k) said linear guide boss being fitted vertically slidably into the linear guide hole so as to be guided thereby.

2. A knockout device for punching a work plate in a press-machine as recited in claim 1, wherein there are provided a plurality of cylinder chambers on said base plate and in the peripheral direction of the actuation-plate guide hole.

3. A knockout device for punching a work plate in a press-machine as recited in claim 1, wherein the cylinder chamber is formed in an annulr configuration.

4. A knockout device for punching a work plate in a press-machine as recited in claim 1, wherein there are provided a plurality of die-stiffener blocks so as to fittingly pass through the peripheral portions of the base plate and of the knockout actuation-plate.

5. A knockout device for punching a work plate in a press-machine as recited in claim 1, wherein there is provided a center side die-stiffener block so as to fittingly pass through the central portion of the knockout actuation-plate and the linear guide boss.

6. A knockout device for punching a work plate in a press-machine as recited in claim 4, wherein there is further provided a center side die-stiffener block so as to fittingly pass through the central portion of the knockout actuation-plate and the linear guide boss.

* * * * *